United States Patent [19]

Hashimoto

[11] Patent Number: 5,594,359
[45] Date of Patent: Jan. 14, 1997

[54] VOLTAGE GENERATING CIRCUIT FOR IC TEST

[75] Inventor: Yoshihiro Hashimoto, Urawa, Japan

[73] Assignee: Advantest Corporation, Tokyo, Japan

[21] Appl. No.: 459,318

[22] Filed: Jun. 2, 1995

[30] Foreign Application Priority Data

Jun. 2, 1994 [JP] Japan ................................. 6-143951

[51] Int. Cl.$^6$ .................................................. G01R 31/28
[52] U.S. Cl. ........................................ 324/765; 324/158.1
[58] Field of Search ................................. 324/765, 763, 324/158.1; 371/22.5; 327/543

[56] References Cited

U.S. PATENT DOCUMENTS 4,716,307  12/1987  Aoyama ................................. 327/543
5,063,304  11/1991  Iyengar ................................. 327/543
5,097,206   3/1992  Perner ................................. 371/22.5
5,111,136   5/1992  Kawashima ......................... 324/158.1
5,349,290   9/1994  Yamada ............................... 324/158.1

*Primary Examiner*—Ernest F. Karlsen
*Attorney, Agent, or Firm*—Knobbe, Marten, Olson & Bear

[57] ABSTRACT

A voltage generating circuit provides little fluctuation of voltage to an IC load when the dynamic character of the IC is tested. In order to achieve this aim, a resistance is inserted between a power supply line and a feedback circuit after the static character of the IC is tested, and a current supply is set to draw current from the connecting point of the inserted resistance. The current supply inversely decreases or increases the amount of current drawn based upon the increment or the decrement of load current which flows through the inserted resistance.

7 Claims, 5 Drawing Sheets

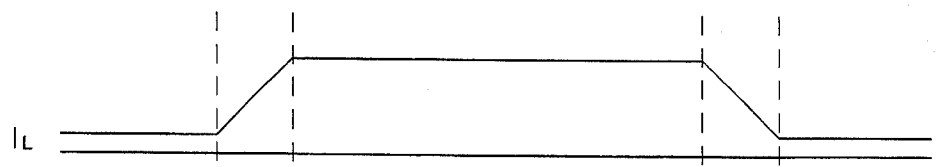
FIG2A
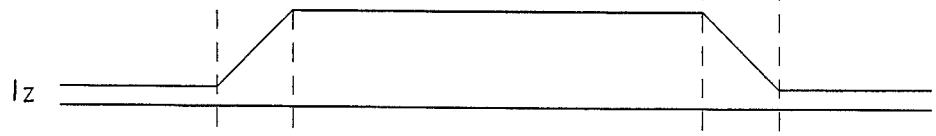
FIG2B
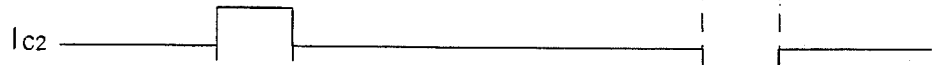
FIG2C
FIG2D
FIG2E
FIG2F
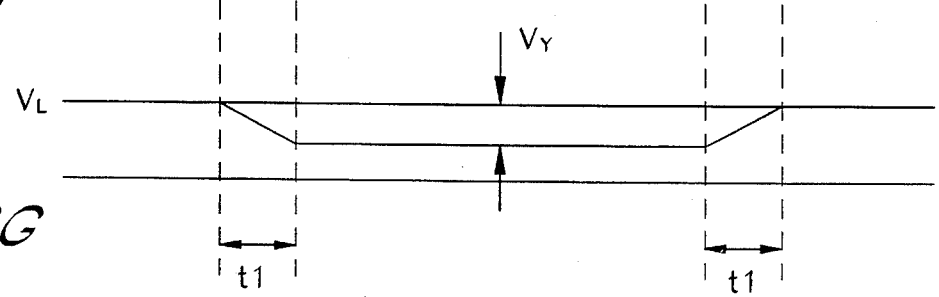
FIG2G

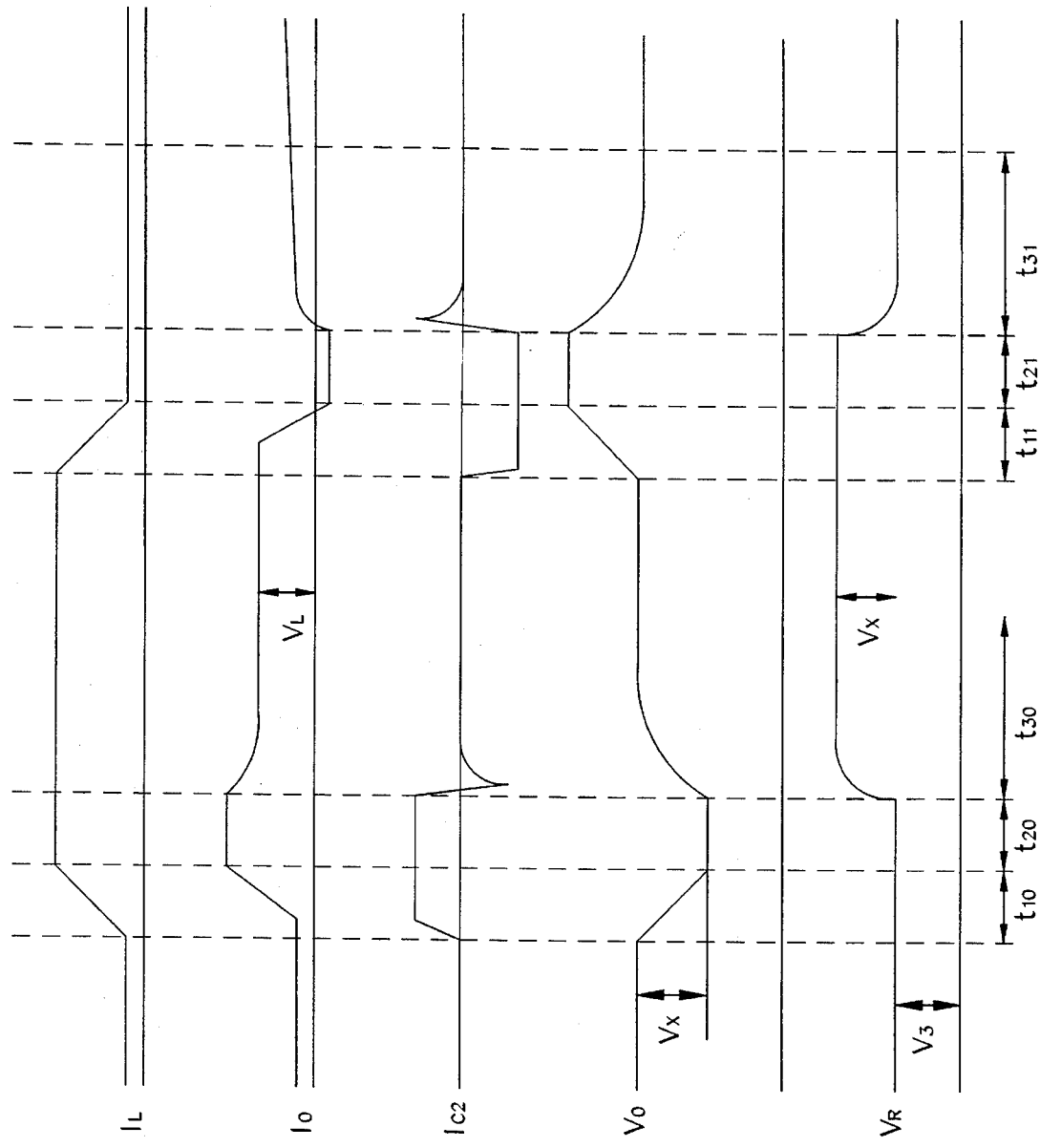

5,594,359

VOLTAGE GENERATING CIRCUIT FOR IC TEST

BACKGROUND OF THE INVENTION

1. Field of the Invention

The present invention relates to a voltage generating circuit for testing integrated circuits (ICs), and, in particular, to a circuit which tests the static character and dynamic character of ICs that have a comparatively large ratio between current in the steady state and current in the dynamic state as in CMOS large-scale integrated circuits (LSIs).

2. Description of the Related Art

FIG. 4 shows an exemplary prior voltage generating circuit which is used for testing a sample high density integrated semiconductor circuit. A load 1 in FIG. 4 represents an IC for which parameters such as the static and the dynamic character are to be tested. A bypass condenser (capacitor) C2 is connected to load 1 in parallel.

A direct current (DC) voltage, Vo, is supplied to the load 1 from an operational amplifier A. By feeding back the voltage Vo which is supplied to the load 1 as an input to the operational amplifier A1 along the line 3, the fluctuation of the voltage Vo which is supplied to load 1 is controlled.

It is preferable that a connecting point O, where the feedback circuit 3 connects to the input of the load 1 to tap the voltage Vo, is as near as possible to load 1.

A voltage supply 2 supplies voltage to a second input (different from the feedback input) of the operational amplifier A1. If the output voltage of a DC voltage supply 2 is Vi, the DC voltage Vo equals Vi in the steady state.

In order to measure the static character of the IC, a current detection resistor R1 and phase compensation condenser (capacitor) C1, which is connected to resistor R1 in parallel, are used to detect the current supplied to the load 1 from the operational amplifier A1.

By measuring the voltage which is generated at the both terminals of the current detection resistor R1 using a differential amplifier (not shown in FIG. 4) as an analog subtract circuit, and by converting the measured voltage into a digital voltage signal using an A/D converter (also not shown), the static character of the load 1 is measured. Specifically, by measuring the current to load 1 for each voltage when the voltage Vi of the DC voltage supply 2 is varied successively, the static character of power supply terminal of load 1 can be measured.

If an inner cell within the IC is defective, the current to the IC increases or decreases in a manner which is not comparable to a set of standard values defined for a good IC of the same structure. Thus, by varying the voltage supplied to the IC and measuring the resulting current to the IC (as reflected by the voltage across the resistor R1) a comparison can be made with the standard values so that the device can be judged as good or defective.

The bypass capacitor C2 is connected to the load 1 in parallel. Furthermore, the phase compensation capacitor C1 is connected in parallel to the current detection resistor R1. The purpose of the bypass capacitor C2 and phase compensation capacitor C1 will be described briefly below.

If the load 1 is a CMOS IC (a VLSI, for example), only several μA (micro ampere) of current will pass into the load 1 as IL in the steady state, while the current IL could measure several A (ampere) during dynamic operation. If the current, IL, which enters load 1 fluctuates by large variations, a significant time may be required to detect the current fluctuation with operational amplifier A1, so that the detected current cannot be relied upon to provide an accurate measurement due to the delay.

Therefore, during the delay period, the bypass capacitor C2 operates to compensate for the fluctuation of the current IL which is sent to the load 1. That is, if the current entering load 1 is increased, the bypass capacitor C2 provides a temporary bypass path for the current. The time during which the capacitor C2 is charging to provide a bypass current path gives the operational amplifier time to adjust via the feedback loop 3 (i.e., the time is sufficient to compensate for the delay of the operational amplifier A1). If, on the other hand, the current sent to load 1 is decreased, the bypass capacitor C2 discharges a current IC2 to add to the current IL. The additional current IC2 maintains the charge current IL essentially constant for a time period approximately equal to the delay necessary for the operational amplifier A1 to respond to the voltage change.

The phase compensation capacitor C1 is provided to prevent the operation of operational amplifier A1 from becoming unstable. That is, the open loop gain of the operational amplifier A1 exhibits a roll-off of −6 dB/oct above a specific cut-off frequency. Therefore, if the bypass capacitor C2 is connected, an attenuation of −12 dB/oct is observed over the frequency $f1=1/(2\pi R1 \cdot C2)$ which is determined by the value of the bypass capacitor C2 and the value of the current detection resistor R1.

If the cutoff frequency associated with the capacitor C2 crosses the 0 dB (unity gain) region of operation of the operational amplifier A1, then this may cause the amplifier to oscillate, so that the operation of the amplifier A1 becomes unstable. To prevent instability, the attenuation characteristics of the operational amplifier circuit are compensated to restore the original −6 dB/oct roll-off before reaching the 0 dB frequency.

For this purpose, the phase compensation capacitor C1 is inserted. The cut-off frequency associated with the capacitor C1 is $f2=1/(2\pi R1 \cdot C1)$.

According to this circuit, the voltage Vo supplied to the load 1 can be changed by changing the voltage Vi given from DC voltage supply 2.

Since the current IL sent to load 1 and the current Io passing through the resistor R1 of the current detection circuit are the same in the steady state, $Io=IL=Vm/R1$ is obtained by voltage Vm output from A/D converter.

The internal resistance RX of load 1 can be calculated using the equation $RX=Vo/Io=Vi \cdot R1/Vm$. Based upon the fluctuation of the internal resistance RX indicated by the fluctuation of input voltage Vo, i.e., the static character can be measured.

The following can be understood from the above explanation.

(1) If the current Io running in the steady state is very small, the resistance value of the current detection resistor R1 is large.

(2) Phase compensation capacitor C1 should be connected to the current detection resistor R1 in parallel.

(3) The bypass capacitor C2 is needed for optimum operation of the circuit.

Using this power supply circuit, a static character test of load 1 is performed and then a functional test is performed with the same measurement apparatus for the IC's which pass the static character test.

The functional test is performed by supplying input signal patterns to a plurality of signal input pins of the LSI. By measuring the output signal patterns provided on the signal output pins, and by comparing the signal patterns taken out with an expected pattern already prepared from a LSI which is known to be good, a determination can be made if the tested LSI is functioning correctly.

Therefore, it is desirable that the power supply voltage which is supplied to load 1 in the functional test is steady.

The state of voltage and current at each point in the conventional circuit of FIG. 4 will be described here with reference to FIG. 5.

FIG. 5A shows load current IL in the steady voltage operation when load 1 is inversed. The time t10 is the rise time of current sent to load 1.

Though the current IO starts to increase gradually with the increase of load current IL as shown in FIG. 5B, the increase of the current IO in response to the load current does not begin immediately because of the delay introduced by the operational amplifier A1.

In order to compensate for this delay, the bypass capacitor C2 discharges the current IC2 to load 1 (FIG. 5C). For this reason, the voltage Vo across the bypass capacitor C2 drops (as shown in FIG. 5D).

The voltage Vo is fed back to the inverting input of the amplifier A1 via the feed-back circuit 3. Because of the voltage drop across the bypass capacitor C2, i.e., the drop of voltage Vo at the point O connecting with feedback circuit 3, the charge current IO (FIG. 5B) starts to increase rapidly from the output of the operational amplifier A1 to the bypass capacitor C2.

As the current IO flows through the current detection resistor R1, so that a voltage drop of Vx=R1·IO is generated across the terminals of resistor R1. Therefore, the voltage VA at the output terminal of the operational amplifier A1 fluctuates as shown in FIG. 5E.

After a time duration t20 of charging the bypass capacitor C2, the current IO starts to decrease and after a time duration t30, the state becomes steady in inverse operation and the current IO becomes equal to the load current IL.

When load 1 returns to steady state after a fall time t11, the character of the voltage and the current at each point is the inverse of the character of the voltage and current during the rise time, as graphically depicted in FIGS. 5C and 5E.

That is, though the load current IL decreases, the current IO keeps on flowing from operational amplifier A1 in response. However, due to the feedback circuit delays, the bypass capacitor C2 is required to provide the extra current temporarily.

Though t20, t30, t21 and t31 are decided by the overall frequency characteristics of the operational amplifier A1, the resistor R1, the capacitor C1, C2, etc., which constitute the configuration of the feedback circuit, the frequency characteristics of the operational amplifier A1 dominate.

Generally, t1X<<t2X<<t3X.

When performing a functional test of load 1 using the voltage generating circuit for IC testing, the voltage Vo supplied to load 1 fluctuates by ±Vx voltage large within the rise time and the fall time as shown in FIG. 5D.

For example, for the case where R1=0.1Ω and Io=5A, the voltage Vo supplied to load 1 fluctuates by as much as 0.5 v. If the voltage Vo fluctuates significantly, the LSI within the load 1 could malfunction or, in the worst case, the large voltage fluctuations could damage the load 1. Furthermore, too much time may be required to judge when the voltage has become stable.

SUMMARY OF THE INVENTION

The purpose of the invention is to provide a steady voltage generating circuit with little change of the voltage VL given to load 1 when performing IC functional test.

In order to accomplish the purpose, in this invention, the conventional circuit configuration for IC test is modified to include switches, while an additional low resistance element is inserted between the connecting point where the voltage Vo supplied to the load LSI (via the feedback circuit) and the load. In addition, a variable current supply is set which inversely decreases or increases its current output by the same amount of current as the increased or the decreased current flowing through the low resistance element from the connecting point and charges it. That is, if the current through the low resistance element increases by an amount A, then the current output by the current supply decreases by an amount A.

Thus, on some occasions a comparatively large current is drawn by the variable current supply from the connecting point while the load is in the steady state, and a small current is supplied to the load. Alternatively, in the inverse operation, the current to be drawn by the current source is small and large current is supplied to the load.

By making the low resistance value less, the fluctuation of power supply voltage to the load becomes less.

For example, if the resistance value is set as R2=0.01 Ω and load current is 5A, the voltage fluctuation Vx becomes 0.05 v=50 mv that is a small fluctuation compared to the voltage fluctuation observed if the resistance is 1/10 ohm.

Furthermore, since the steady state can be obtained quickly, the measuring can be performed at high speed.

BRIEF DESCRIPTION OF THE DRAWINGS

FIG. 2 is a waveform diagram which is useful in depicting the operation of the circuit embodiment of FIG. 1.

FIG. 5 is a waveform diagram which is useful for describing the operation of FIG. 4.

DETAILED EXPLANATION OF THE INVENTION

Figure 1:
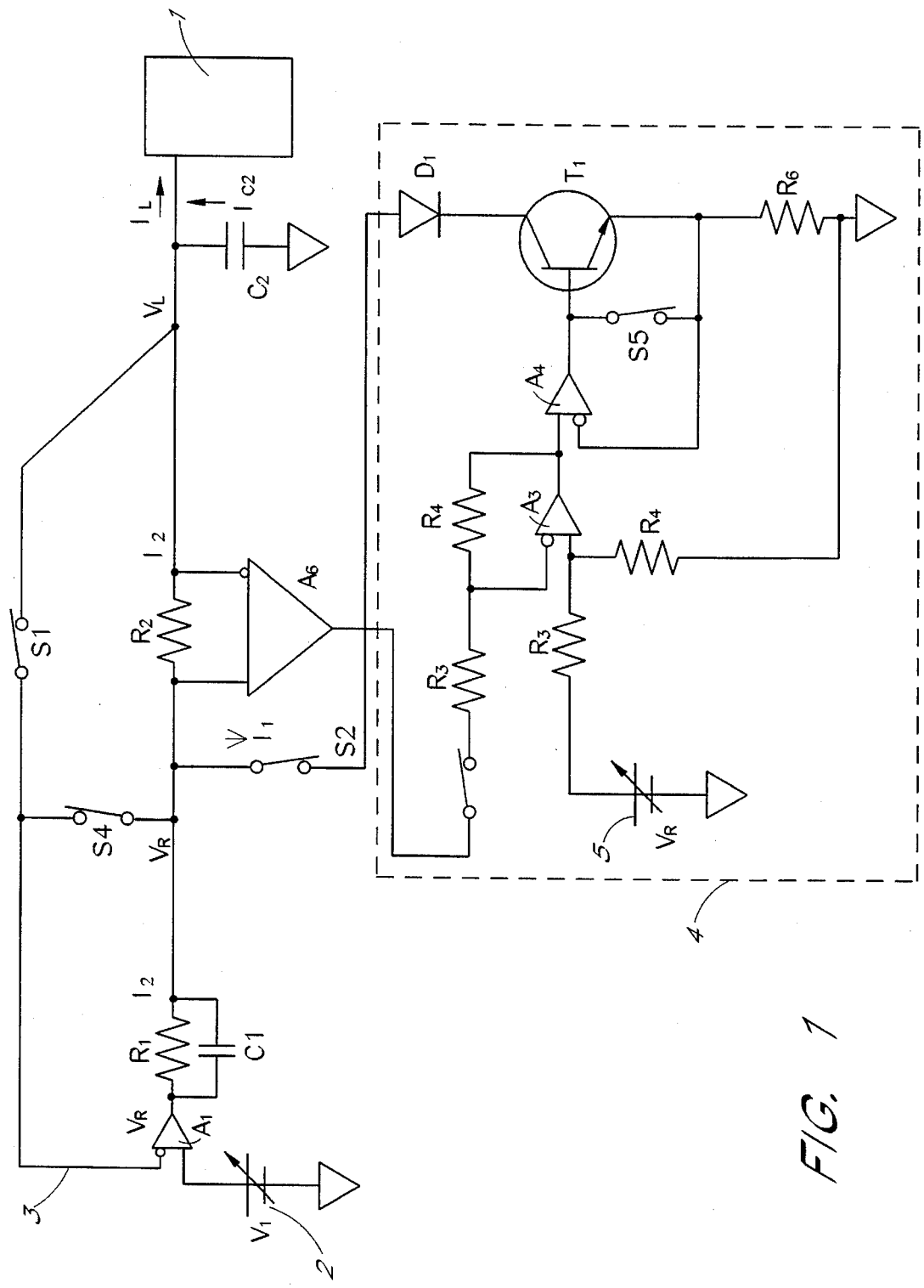
FIG. 1 is a schematic diagram which shows an embodiment of the invention.

The embodiment of this invention is shown in FIG. 1.

Figure 4:
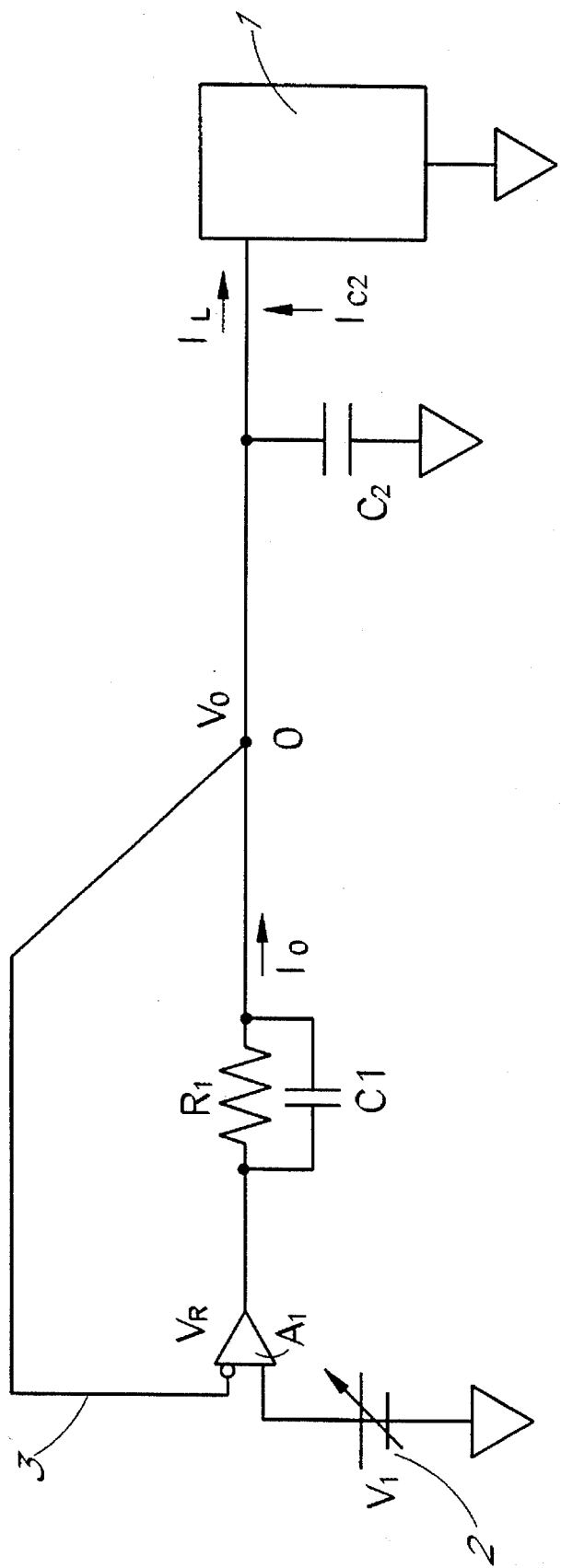
FIG. 4 is a schematic diagram which shows the conventional technology.

The elements of FIG. 1 corresponding to those in FIG. 4 are identified by the like reference letters or numbers.

In the schematic diagram of FIG. 1, the static character of the IC 1 is measured in the same manner as the conventional circuit by switching S1 and S5 on (closed), and switching S2, S3 and S4 off (open).

When measuring the dynamic character of the load 1, the switches S1 and S5 are opened, and switches S2, S3 and S4 are closed. The low resistance R2 is inserted between the connecting point O, where the voltage to be sent to load 1 is taken out via feedback circuit 3, and load 1. The current I1 is drawn by the variable current supply 4 from the connecting point O.

The voltage Vy which is generated across the resistor R2 in proportion to the current I2, drives the variable current supply 4 through a differential amplifier AS. The variable current supply 4 draws the current I1, which is in inverse proportion to the generated voltage Vy of low resistance R2, from the connecting point O.

This operation of the circuit of FIG. 1 will be described in detail below.

As shown in FIG. 1, the voltage which is generated at the both terminals of low resistance R2 is supplied to the inputs of the differential amplifier A5. The output of the amplifier A5 acts as an input to one of the input terminals of an operational amplifier A3. A reference voltage, Vr, is supplied to the other terminal of the amplifier A3 from a reference voltage supply 5. Resistors R3 and R4, together with the amplifier A3, form a DC amplifier of with gain n=R4/R3.

By driving transistor T1 with the output voltage of operational amplifier A3 through a voltage follower amplifier A4, the current I1 is drawn from the connecting node O.

The charge current I1 becomes is calculated as I1=n(Vr−R2·I2)/R5=K−I2·(n·R2/R5), where K represents a constant current value. Compared with the constant reference current K, the current I1 decreases as much as the increased current I2 which is supplied to load 1.

Alternatively, the current I1 increases as much as the decreased current I2. K=n·Vr/R5 in this case. In this way, once the voltage Vo of the connecting point O is set, the voltage is always steady.

Also, the output current Io of the operational amplifier A1 always operates steadily, and the voltage fluctuation given to load 1 becomes very small.

The following describes the steady operation of the circuit of FIG. 1 more particularly using numerical values.

When the voltage is steady during the measurement of operation, the voltage Vo of the connecting point O is equal to the voltage Vi of the DC voltage supply 2, (i.e., Vo=Vi).

The potential difference Vy across both terminals of the low resistance element R2 is: Vy=R2·I2.

When the reference voltage of reference voltage supply 5 is Vr, the output voltage Vb of differential amplifier A3 is: Vb=n (Vr-R2·I2)=n(Vr-R2·I2).

The charge current I1 is: I1=Vb/R5=n (Vr-R2·I2)/R5= K·I2·(n·R2/R5).

Therefore, the current I1 conversely decreases or increases as much as the current I2 supplied to load 1 increases or decreases.

Also output current Io of the operational amplifier A1 is: Io=I1+I2=[n(Vr·R2·I2)/R5]+I2=[I2·(R5-n·R2)+n·Vr]/RS.

If the resistance R5 is selected as: R5=n·R2, Io=n·Vr/R4, and the output current Io of operational amplifier A1 always keep a steady value.

The relation of the voltage and current supplied to the load 1 will be described here with reference to FIG. 2.

FIG. 2A shows a waveform of the load current IL which has grown larger by inverse operation of the load 1.

The t10 is the rise time and t11 is the fall time for the current IL.

When the load current IL starts to rise, the current I2 from the power supply begins to increase as shown in FIG. 2B. To make up for the current shortage, discharge current IC2 flows from bypass capacitor C2 as shown in FIG. 2C.

According to the increment of current I2, the current I1 drawn by the variable current supply 4 decreases the current by an amount equal to the increment of current I2 as shown in FIG. 2D. Therefore, the output current Io of the operational amplifier A1 does not fluctuate as shown in FIG. 2E.

As the output current Io does not fluctuated the voltage Vo of the connecting point O also does not fluctuate and the power supply side can keep on supplying a stable voltage Vo. Also, the voltage VL which is supplied to the load 1 is: VL=Vo·R2·I2. Thus, since R2 is a very low resistance, fluctuation of the voltage VL is small.

As mentioned above, if R2 is 0.01 Ω and I2 is 5A, the fluctuation of load voltage VL is 50 mV.

This voltage fluctuation can therefore be made on the order of 1/10 of the voltage fluctuations observed in the conventional circuit of FIG. 4, depending on the selection of resistance R2. In addition, the voltage turns steady so quickly that high speed measurement can be performed.

Figure 3:
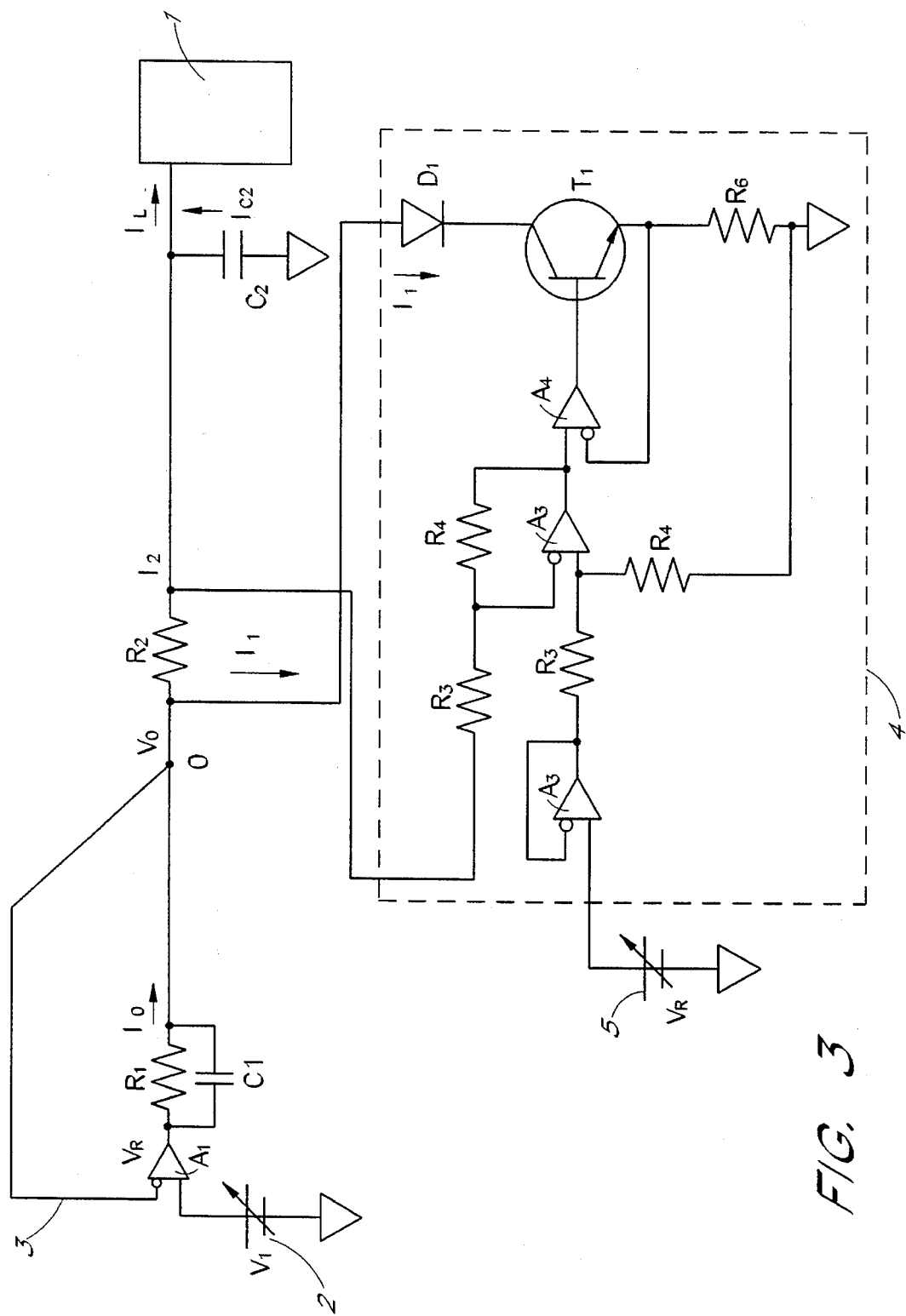
FIG. 3 is a schematic diagram which shows another embodiment of the invention.

FIG. 3 shows another embodiment of the circuit for use in the functional test of the IC 1.

The circuit elements corresponding to those in FIG. 1 are identified by the like reference letters and numerals, and the switches are omitted.

In the embodiment of FIG. 1, the potential Vy across the low resistance R2, and the reference voltage Vr, are compared at the inputs of the differential amplifier A3.

In an alternative embodiment of FIG. 3, the voltage VL, which is supplied to the load 1, and the reference voltage Vr are compared using a differential amplifier A3. That is, the reference voltage Vr is applied to one of the input terminals of the differential amplifier A3 from reference voltage supply 5, while the load voltage VL is applied to the other terminal through a voltage follower A6.

The voltage of the connecting point is Vo, and reference voltage Vr is set to: Vr=Vo+Vc. Vc here is the selected value to decide the maximum value of current I2 to be charged.

Load voltage VL is: VL=Vo+R2·I2.

Therefore, the output voltage Vb of the differential amplifier A3 is: Vb=n(VL−Vr)=n(Vo+R2·I2−Vo+Vc)=n(Vc+ R2·I2).

By driving transistor T1 with voltage Vb through voltage follower A4, the current I1 is drawn from the connecting point O.

The current I1 becomes: I1=Vb/R5=n(Vc+R2·I2)/R5= Ko·I2(n·R2/R5). That is, if I2 increases or decreases, I1 decreases by an amount equal to the increment of I2 or I1 increases by an amount equal to the decrement of I2.

The output current Io of the operational amplifier A1 at this time becomes; IO=I1+I2=[n(Vc+R2·I2)/R5]+I2= [I2(R5-n·R2)+n·Vc]/R5. If R5=n·R2 is selected., Io=n·Vc/ R5, and the output current Io of operational amplifier A1 becomes steady to operate stably without any fluctuation of the voltage output by the power supply circuit.

As described above particularly, in this invention, the circuit structure is modified with the plurality of switches S1–S5 for the measurement of the static character and dynamic character of the load 1.

For the static character, the measurement is performed accurately and quickly with the conventional circuit structure while for the dynamic character, the measurement is performed with the modified circuit structure described herein in accordance with an aspect of the present invention.

Therefore, the voltage fluctuation at the time of dynamic character measurement becomes on the order of 1/10 of the voltage fluctuations observed in the conventional circuit so that the steady voltage characteristics of the circuit becomes better. Thus, the present invention alleviates risks of malfunction and damage of the load. The time in which the measurements of the load LSI circuit are taken is greatly reduced. In this manner, the technological advantages are very significant for improving an IC measuring apparatus, and the economical advantages are also very significant since the measuring time is greatly reduced.

I claim:

1. A voltage generating circuit for testing an IC device, comprising:

an operational amplifier for supplying a specified DC voltage to a power supply terminal of an IC device to be tested; one input terminal of said operational amplifier is provided with a reference voltage to determine said DC voltage;

a bypass capacitor connected between said power supply terminal and a ground of said voltage generating circuit in parallel with said IC device;

a feedback circuit to feedback said DC voltage to other input terminal of said operational amplifier;

a first current detection resistor connected between an output of said operational amplifier and said power supply terminal for detecting a current flowing to said IC device based on a voltage drop across said first detection resistor;

a phase compensation capacitor connected in parallel with said first current detection resistor;

a second current detection resistor connected between said first current detection resistor and said power supply terminal for detecting a transient current which is an abrupt change in said current to said IC device arises when said IC device changes its logic state, said transient current is detected based on a voltage drop across said second detection resistor; and a variable current supply for withdrawing a current from or supplying a current to said current flowing to said IC device to cancel said transient current when said voltage drop across said second current detection resistor deviates from a predetermined voltage value.

2. A voltage generating circuit as defined in claim 1, wherein said variable current supply withdraws or supplies said current to said current flowing to said IC device at a point between said first current detection resistor and said second current detection resistor.

3. A voltage generating circuit as defined in claim 1, wherein said variable current supply includes a current source having a high internal impedance to provide a constant current flow to or from said current flowing to said IC device.

4. A voltage generating circuit as defined in claim 1, wherein a resistance value of said second current detection resistor is significantly smaller than a resistance value of said first current detection resistor.

5. A voltage generating circuit as defined in claim 1, wherein said voltage drop across said second current detection resistor is received by a differential amplifier connected to said variable current supply.

6. A voltage generating circuit as defined in claim 1, wherein said voltage drop across said second current detection resistor is detected by comparing a voltage at said power supply terminal of said IC device and a reference voltage provided to said variable current supply.

7. A voltage generating circuit as defined in claim 1, wherein said variable current supply includes an operational amplifier one input terminal of which is provided with said voltage drop across said second current detection resistor while the other input terminal of which is provided with said predetermined voltage value.

* * * * *